(12) United States Patent
Kim et al.

(10) Patent No.: US 7,348,661 B2
(45) Date of Patent: Mar. 25, 2008

(54) ARRAY CAPACITOR APPARATUSES TO FILTER INPUT/OUTPUT SIGNAL

(75) Inventors: Hyunjun Kim, Folsom, CA (US); Ping Sun, Gilbert, AZ (US); Jiangqi He, Gilbert, AZ (US); Xiang Yin Zeng, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/949,582

(22) Filed: Sep. 24, 2004

(65) Prior Publication Data

US 2006/0071341 A1    Apr. 6, 2006

(51) Int. Cl.
*H01L 23/02* (2006.01)
*H01G 4/005* (2006.01)

(52) U.S. Cl. ............ 257/678; 257/690; 257/693; 257/697; 257/700; 257/724; 257/303; 257/306; 257/528; 257/532; 257/924; 257/E23.057; 257/E21.008; 361/306.2; 361/310

(58) Field of Classification Search ........ 257/177–182, 257/503, 666–798
See application file for complete search history.

(56) References Cited

U.S. PATENT DOCUMENTS

| | | | | |
|---|---|---|---|---|
| 4,349,862 A | * | 9/1982 | Bajorek et al. | 361/762 |
| 4,879,631 A | * | 11/1989 | Johnson et al. | 361/684 |
| 5,177,670 A | * | 1/1993 | Shinohara et al. | 361/738 |
| 5,574,630 A | * | 11/1996 | Kresge et al. | 361/792 |
| 5,635,767 A | * | 6/1997 | Wenzel et al. | 257/778 |
| 5,808,878 A | * | 9/1998 | Saito et al. | 361/818 |
| 5,854,534 A | * | 12/1998 | Beilin et al. | 257/691 |
| 5,880,925 A | * | 3/1999 | DuPre et al. | 361/303 |
| 5,939,782 A | * | 8/1999 | Malladi | 257/698 |
| 6,058,004 A | * | 5/2000 | Duva et al. | 361/301.4 |
| 6,265,764 B1 | * | 7/2001 | Kinsman | 257/676 |
| 6,281,042 B1 | * | 8/2001 | Ahn et al. | 438/108 |
| 6,320,249 B1 | * | 11/2001 | Yoon | 257/678 |
| 6,423,577 B1 | * | 7/2002 | Cheng et al. | 438/118 |
| 6,535,398 B1 | * | 3/2003 | Moresco | 361/792 |
| 6,548,328 B1 | * | 4/2003 | Sakamoto et al. | 438/121 |
| 6,606,237 B1 | | 8/2003 | Naito et al. | |
| 7,095,108 B2 | * | 8/2006 | Palanduz | 257/700 |
| 7,242,073 B2 | * | 7/2007 | Mosley et al. | 257/532 |
| 2002/0015293 A1 | * | 2/2002 | Akiba et al. | 361/793 |
| 2003/0209793 A1 | * | 11/2003 | Nishizawa et al. | 257/679 |
| 2004/0184219 A1 | * | 9/2004 | Otsuka et al. | 361/306.3 |
| 2005/0052822 A1 | | 3/2005 | Shimizu et al. | |

FOREIGN PATENT DOCUMENTS

JP        6-163805      * 6/1994

* cited by examiner

*Primary Examiner*—Jasmine Clark
(74) *Attorney, Agent, or Firm*—Schwabe, Williamson & Wyatt, P.C.

(57) ABSTRACT

An apparatus for filtering noise from an input/output (I/O) signal is disclosed. In various embodiments, the apparatus may be an array capacitor, and may be disposed between an electronic package and an underlying substrate such as a printed circuit board.

26 Claims, 6 Drawing Sheets

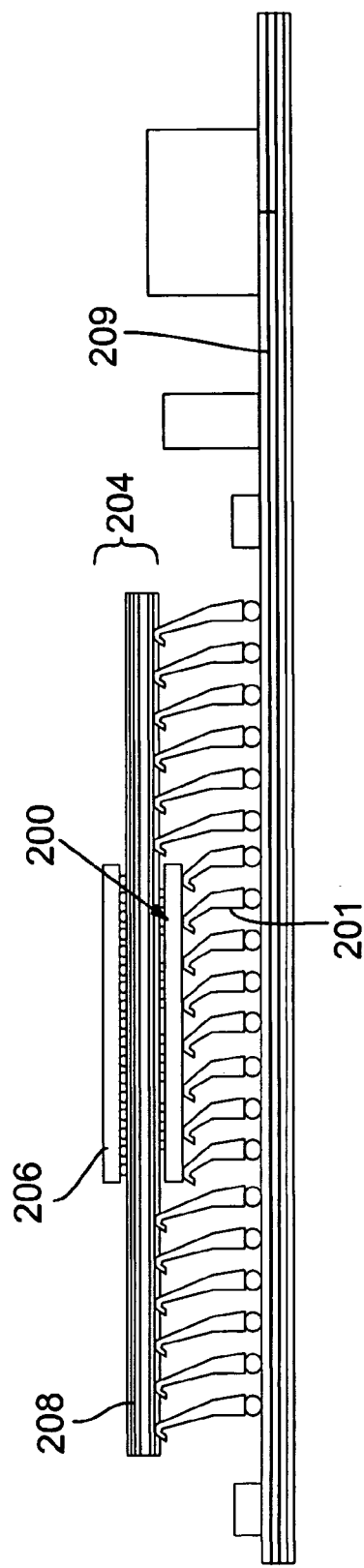

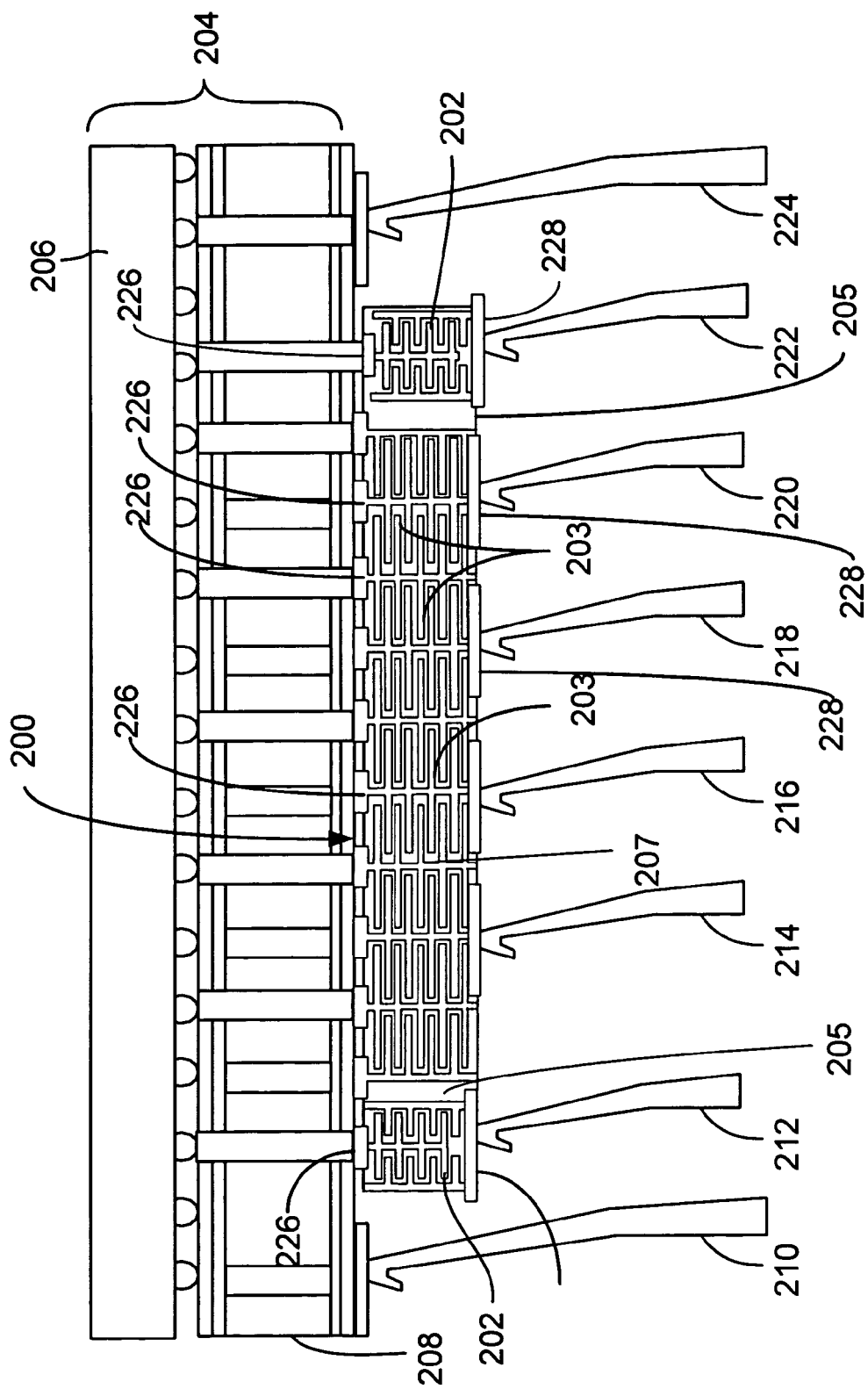

500

ARRAY CAPACITOR APPARATUSES TO FILTER INPUT/OUTPUT SIGNAL

BACKGROUND OF THE INVENTION

1. Field of the Invention

Embodiments of the present invention relate to, but are not limited to, electronic devices, and in particular, to the field of noise filtration in electronic devices.

2. Description of Related Art

In the current state of electronics, electronic packages and devices are often coupled to an underlying substrate such as a printed circuit board (PCB), sometimes referred to as a motherboard. The electronic packages themselves typically include a die that is mounted on top of a carrier substrate. The die may be comprised of an electronic device such as a microprocessor, volatile memory, embedded passive components, and the like.

One problem commonly associated with the various signals transmitted between the various electronic packages (components) coupled to the PCB is noise in the signals. The source for the noise may be due to several factors including high frequency switching. The presence of such noise in, for example, input/output (I/O) signals that are being transmitted through the PCB may seriously impede the performance of the various components that resides on the PCB. In order to remove the noise from I/O signals, filters are often disposed directly onto the PCB substrate. For example, it is known that to separate common mode noise from a differential signal, capacitors may be used to filter out the common mode noise. The current state-of-the-art solution is to use small discrete 2-terminal capacitors that are mounted on the PCB. As a result, the I/O signals that are being transmitted through the PCB are also being filtered in the PCB.

FIG. 1 depicts the circuitry of a conventional PCB that includes filters for removing common mode noise from differential mode signals. The conventional approach for removing common mode noise from differential mode signals is to use filters such as discrete 2-terminal capacitors (see ref. 102 of FIG. 1) that are disposed directly on the PCB. Unfortunately, such components may give rise to reliability issues and increase manufacturing and/or processing costs. In addition, such discrete components on a PCB can be a bottleneck in shrinking PCB size, and in turn, the form factor of a system.

BRIEF DESCRIPTION OF DRAWINGS

The present invention will be described by way of exemplary embodiments, but not limitations, illustrated in the accompanying drawings in which like references denote similar elements, and in which:

FIG. 2A illustrates an array capacitor disposed between an electronic package and substrate in accordance with some embodiments;

FIG. 2B illustrates the array capacitor of FIG. 2A, in further detail, in accordance with some embodiments;

DETAILED DESCRIPTION OF ILLUSTRATIVE EMBODIMENTS

Figure 1:
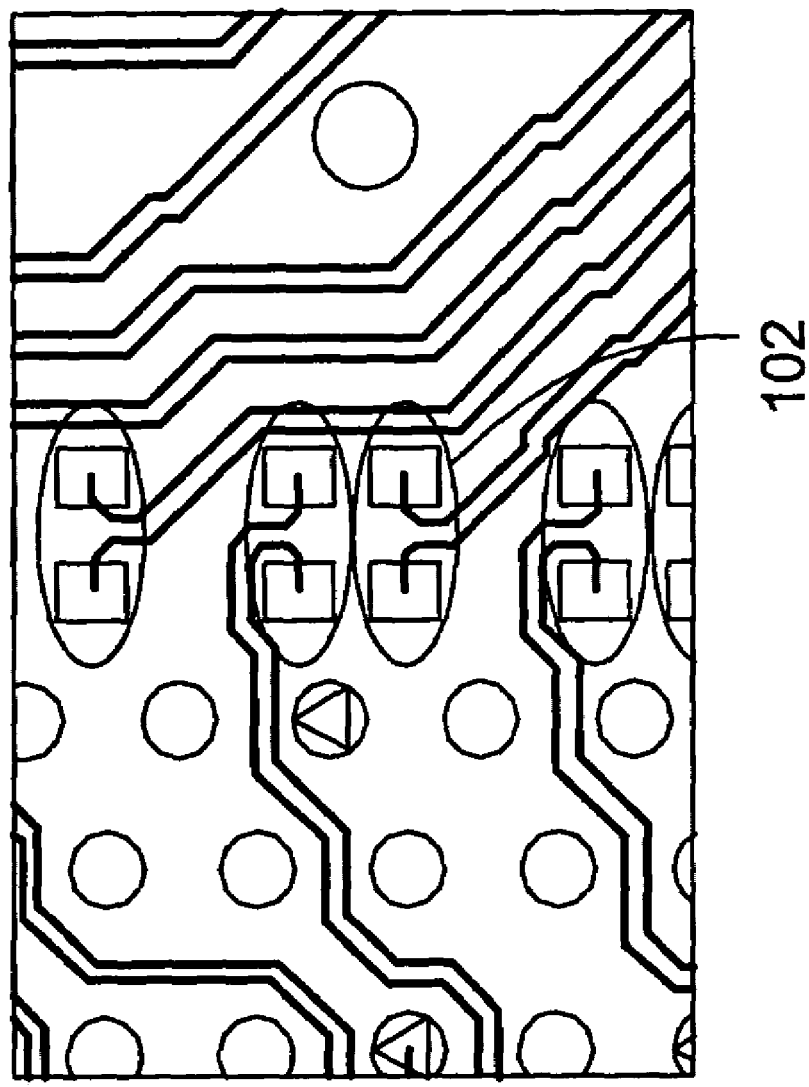
FIG. 1 illustrates conventional discrete capacitors on a printed circuit board.

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention.

The following description includes terms such as on, onto, between, underlying, top, bottom, and the like, that are used for descriptive purposes only and are not to be construed as limiting. That is, these terms are terms that are relative only to a point of reference and are not meant to be interpreted as limitations but are instead, included in the following description to facilitate understanding of the various aspects of the invention.

According to various embodiments of the invention, array capacitors for filtering out noise from input/output signals are provided. In various embodiments, the array capacitors may be adapted to be disposed between an electronic package and an integrated circuit substrate such as a printed circuit board (PCB). For the embodiments, the array capacitors may include one or more first capacitive units for filtering out noise from I/O signals. For these embodiments, the array capacitors may further include one or more second capacitive units for providing ground and/or power. In various embodiments, the one or more first capacitive units may be electrically isolated from the one or more second capacitive units. In various embodiments, the first capacitive units may filter out single mode noise from input/output signals such as peripheral component interconnect (PCI) differential mode signals. In other embodiments, however, other types of signaling may be filtered by the first capacitive units.

According to various embodiments, apparatuses that include an array capacitor capable of filtering out noise from input/output (I/O) signals and disposed between an electronic package and a integrated circuit substrate is provided. For purposes of this description, the term I/O signals refers to input and/or output signals. For the embodiments, the electronic package may include a die and a carrier or package substrate. In other embodiments, however, the electronic package may be a die without packaging. In various embodiments, the die may be a processor, input/output device, volatile memory, embedded passive components (e.g., embedded inductor, balance and unbalance (balun), and the like), and other types of components. In some embodiments, the integrated circuit substrate may be a printed circuit board (PCB). Additionally, in various embodiments, the array capacitor used for removing the noise from I/O signals may also be adapted to provide ground/power to an electronic package.

According to various embodiments, by placing an array capacitor such as the one described above between, for example, an electronic package and an underlying substrate such as a PCB substrate, filters (e.g., discrete capacitors) may be removed from the PCB substrate. By removing the capacitors from the PCB substrate and replacing the capacitors with an array capacitor adapted for filtering I/O signals, improved filtering may be achieved while allowing for the reduction in size of the PCB.

FIG. 2A depicts an array capacitor adapted to filter I/O signals and disposed between an electronic package and a substrate in accordance with some embodiments. For the embodiments, the array capacitor 200 is electronically coupled to conductive leads 201 that are further coupled to an underlying substrate 209. In various embodiments, the conductive leads 201 may be land grid array (LGA) leads and the substrate 209, in various embodiments, may be an integrated circuit substrate such as a printed circuit board (PCB). The array capacitor 200 may also be coupled to an electronic package 204, which includes a die 206 and a package or carrier substrate 208. In various embodiments, by disposing the array capacitor 200 between the electronic package 204 and the substrate 209, disposition of at least some discrete capacitors on the substrate 209 may be avoided.

FIG. 2B depicts the array capacitor of FIG. 2A, in greater detail, in accordance with some embodiments. For the embodiments, the array capacitor 200 may include first capacitive units 202. The array capacitor 200 may further include second capacitive units 203 that are electrically isolated from the first capacitor units 202 by a dielectric material 205 that is disposed between the first capacitive units 202 and second capacitive units 203. The second capacitive units 203 make up a bulk array capacitor 207. The array capacitor 200 may be disposed between the electronic package 204 and the underlying substrate 209 as depicted in FIG. 2A.

In various embodiments, the first capacitor units 202 and the second capacitive units 203 are electrically coupled to a first set and a second set of contact pads 226 and 228. The first set of contact pads 226 couples the array capacitor 200 to the electronic package 204 while the second set of contact pads 228 couples the array capacitor 200 to the conductive leads 212 to 222.

In various embodiments, the second capacitive units 203 that make up the bulk array capacitor 207 may be adapted to provide and/or filter power and/or ground to the electronic package 204. The electronic package 204, which includes a die 206 and a carrier substrate 208, may be electronically coupled to the underlying substrate 209 through conductive leads 210 and 224 (in this case, LGA leads) and through the array capacitor 200 and conductive leads 212 to 222. Note that in various other embodiments, the electronic package 204 may comprise only the die 206 without the carrier substrate 208. That is, in some embodiments, the electronic package 204 may not be a package at all but may be a bare die. In various embodiments, the die 206 may be a processor, an input/output device, volatile memory, and the like.

The first capacitive units 202, in various embodiments, may be adapted to filter I/O signals such as PCI differential mode signals. For these embodiments, the first capacitive units 202 may be employed in order to remove single mode noise from the differential mode I/O signals. The bulk array capacitor 207 (i.e., second capacitive units 203), on the other hand, may be used to filter and provide ground and/or power between, for example, the electronic package 204 and the underlying substrate 209. That is, in some embodiments, some of the second capacitive units 203 may be dedicated to ground while other second capacitive units 203 may be dedicated to power. For the illustrated embodiments, these capacitive units are arranged in a side-by-side configuration, with the ones employed to filter out noises in I/O signals being disposed in the periphery, and electrically isolated from the ones being employed to provide ground and/or power.

Figure 3:
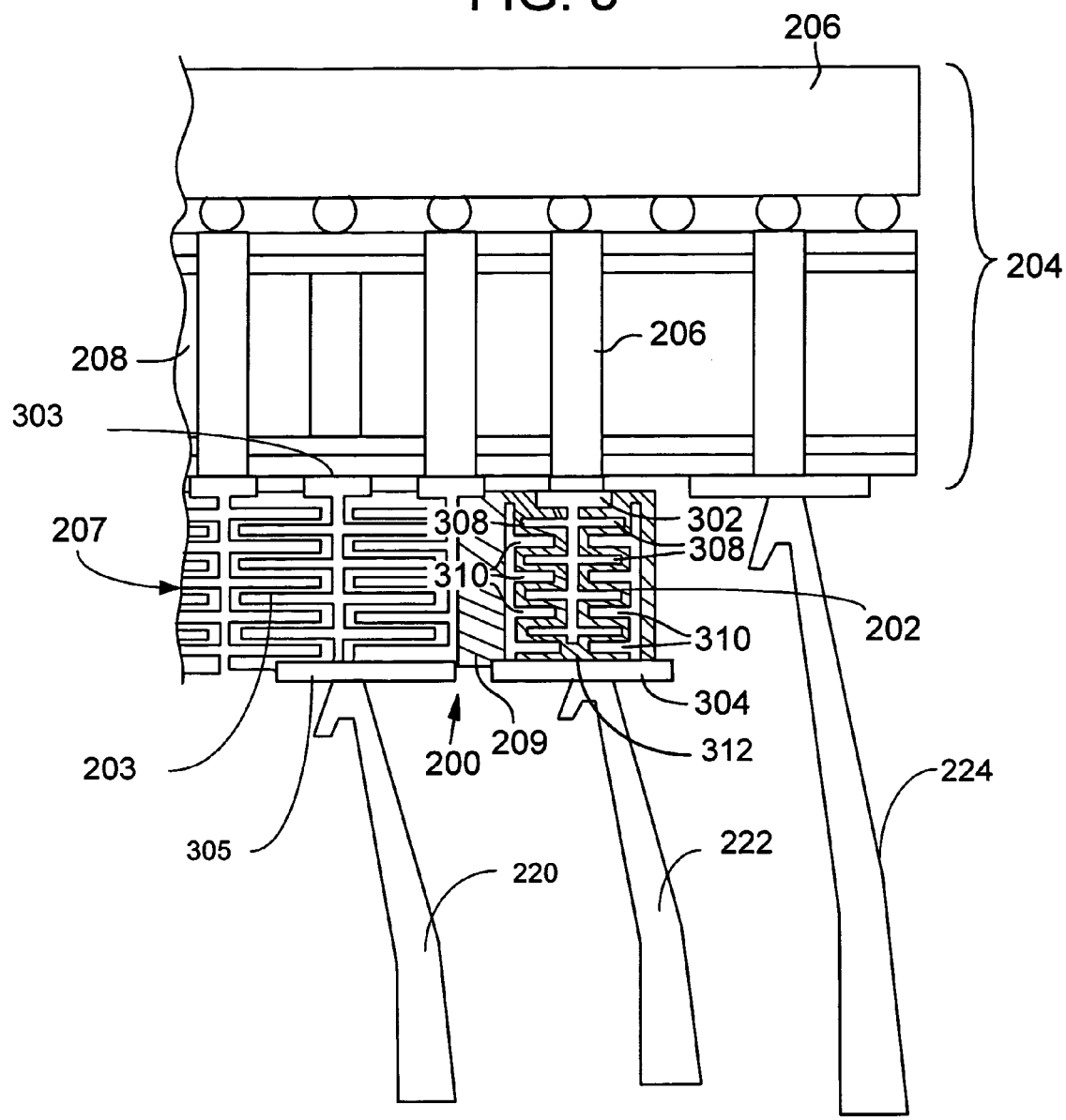
FIG. 3 illustrates the first capacitive unit of FIG. 2B, in further detail, in accordance with some embodiments.

FIG. 3 depicts one of the first capacitive units 202 of FIG. 2B, in further detail, in accordance with some embodiments. For the embodiments, the first capacitive unit 202 may be electrically isolated from the bulk array capacitor 207 (e.g., second capacitive units 203) by a dielectric material 209.

The second capacitive unit 203 is coupled to a top and a bottom contact pads 303 and 305. Similarly, the first capacitive unit 202 is coupled to a top and a bottom contact pads 302 and 304. The top contact pads 302 and 303 may be adapted to interface with the electronic package 204 while the bottom contact pads 304 and 305 may be adapted to interface with conductive leads 220 and 222. The top contact pad 302 for the first capacitive unit 202 may be interfaced with a conductive interconnect 306 that may be imbedded within the carrier substrate 208. The conductive interconnect 306 may be electrically coupled to the die 206 on the side of the carrier substrate 208 opposite the array capacitor 200.

According to various embodiments, the first capacitive unit 202 may include multiple conductive planes or capacitor layers. For these embodiments, the top contact pad 302 may be electrically coupled to a first set of capacitor layers 308 while the bottom contact pad 304 may be coupled to a second set of capacitor layers 310. Deposited between each set of layers 308 and 310 is a dielectric 312. The two sets of capacitor layers 308 and 310 represents a first capacitive unit 202. In various embodiments, the first capacitive unit 202 may be adapted to filter out noise from I/O signals. Note that in other embodiments, other types of capacitive units with different capacitive structures may be employed.

In various embodiments, the array capacitor 200 may be used to filter out noise from peripheral component interconnect (PCI) differential mode signals being transmitted between the electronic package 204 and the underlying substrate 209. By placing such an array capacitor 200 between an electronic package and the underlying PCB substrate, discrete capacitors may be removed from the PCB substrate without degrading overall electrical performance. Further, by shortening the distance between, for example, a package die and a capacitor (that may be included with an array capacitor 200), the signal noise introduced from, for example, long transmission lines may be eliminated more effectively. Further, by removing discrete capacitors from the PCB, the PCB may be made more compact.

Note that although in the embodiments described above, the array capacitor 200 is depicted as having both a bulk array capacitor 207 (e.g., second capacitive units 203) for filtering power/ground noise and first capacitive units 202 for filtering common mode noise of I/O signals, in other embodiments, the array capacitor 200 may only include the first capacitive units 202. That is, in these embodiments, the array capacitor 200 may not include the bulk array capacitor 207 and may instead be employed only for filtering input/output signals and/or for other purposes.

Figure 4:
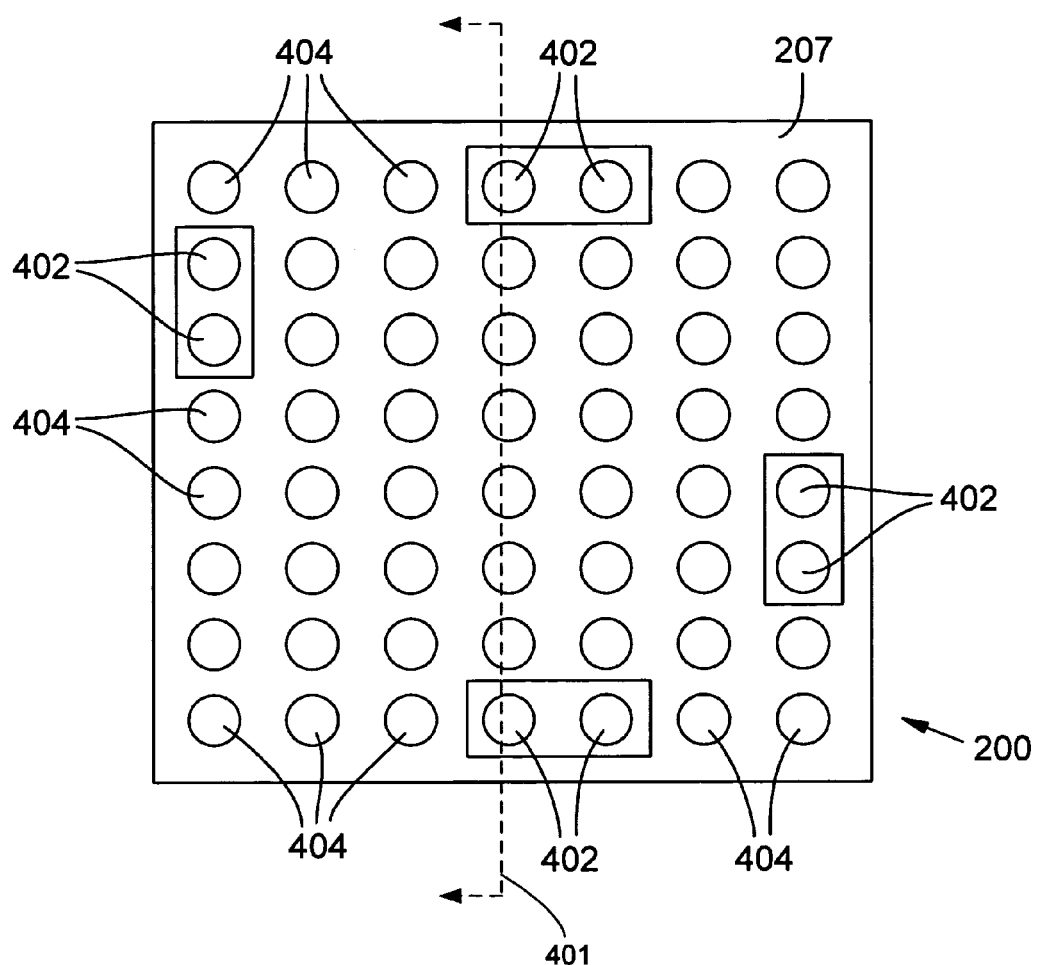
FIG. 4 illustrates a top down view of the array capacitor of FIG. 3 in accordance with some embodiments.

FIG. 4 depicts a top down view of the array capacitor 200 of FIG. 2 including a cut line 401 showing the cross sectional view of FIG. 4 in accordance with some embodiments. For the embodiments, the array capacitor 200 may include multiple top contact pads 402 and 404 (302 and 303 respectively in FIG. 3), some of which may be dedicated to power and/or ground (i.e., ground/power pads 402) while others may be dedicated to input/output signals (i.e., I/O pads 404). Although not shown here in this figure, as depicted in FIG. 2, the top contact pads 402 and 404 may be coupled to first and second capacitive units 202 and 203. In various embodiments, the top contact pads 402 that are dedicated to power and/or ground may be associated with the bulk array capacitor 207.

In various embodiments, the I/O signals being transmitted through the array capacitor 200 may be differential signal pairs. For these embodiments, the I/O pads 402 that are dedicated to I/O signals may be located within the capacitor array 200 as pairs. That is, when the I/O signals being transmitted through the first capacitive units 202 (and the I/O pads 402) are differential signals, each signal of a pair of I/O signals represents a first and second portions of a differential I/O signal pair. Two signal paths are therefore generally used in transmitting a differential signal pair. Thus, as depicted in FIG. 4, all of the I/O pads 402 are paired.

In other embodiments, however, the I/O pads 402 may not be paired but instead may be unpaired pads (hence, their associated first capacitive units 202 may also be unpaired). Further, for these embodiments, the I/O pads 402 may be located at the periphery of the bulk array capacitor 207 or the array capacitor 200. As a result, the first capacitive units 202 that are coupled to the I/O pads 402 may also be located at the periphery of the bulk array capacitor 207 or the array capacitor 200. In other embodiments, however, one or more of the I/O pads 402 may not be located at the periphery of the bulk array capacitor 412 but instead may be located within the bulk array capacitor 207.

Figure 5:
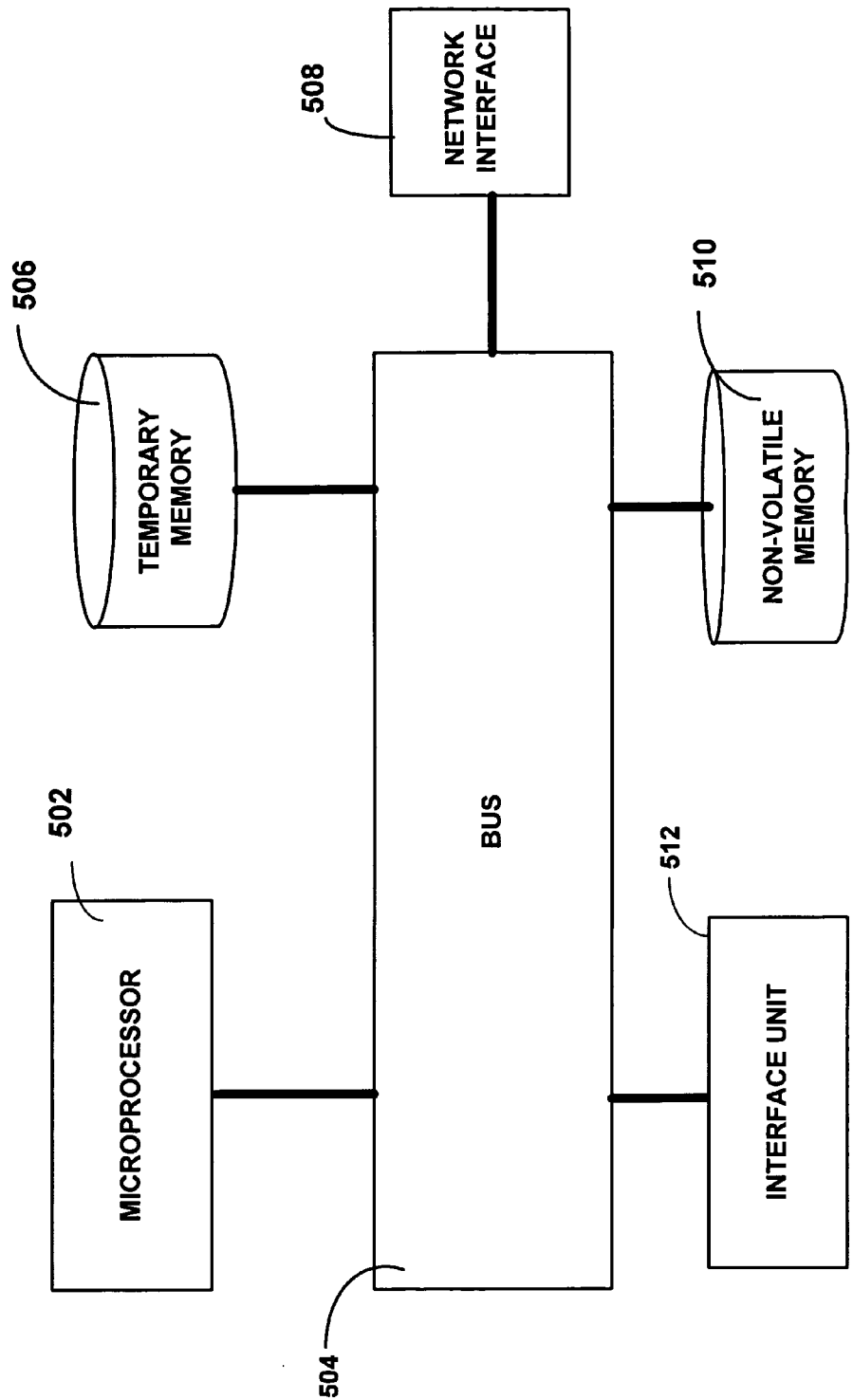
FIG. 5 is a block diagram of an example system, according to some embodiments of the invention.

Referring now to FIG. 5, where a system 500 in accordance with some embodiments is shown. The system 500 includes a microprocessor 502 that may be coupled to a bus 504. The system 500 may further include temporary memory 506, a network interface 508, an optional nonvolatile memory 510 (such as a mass storage device) and an input/output (I/O) device interface unit 512. In some embodiments, the input/output device interface unit 512 may be adapted to interface a keyboard, a cursor control device, and/or other devices. One or more of the above-enumerated elements, such as microprocessor 502, temporary memory 506, nonvolatile memory 510, and so forth, may be coupled to the bus 504 via the array capacitor 200 described above.

Depending on the applications, the system 500 may include other components, including but not limited to chipsets, RF transceivers, mass storage (such as hard disk, compact disk (CD)), digital versatile disk (DVD), graphical, or mathematic coprocessors, and so forth.

One or more of the system components may be located on a single chip such as a system on chip (SOC). In various embodiments, the system 500 may be a personal digital assistant (PDA), a wireless mobile phone, a tablet computing device, a laptop computing device, a desktop computing device, a set-top box, an entertainment control unit, a digital camera, a digital video recorder, a media recorder, a media player, a CD player, a DVD player, a network server, or device of the like.

Although specific embodiments have been illustrated and described herein, it will be appreciated by those of ordinary skill in the art that any arrangement which is calculated to achieve the same purpose may be substituted for the embodiments shown. This application is intended to cover any adaptations or variations of the embodiments of the present invention. Therefore, it is manifestly intended that this invention be limited only by the claims.

What is claimed is:

1. An apparatus, comprising:
   a first contact pad adapted to couple with an electronic package;
   a second contact pad adapted to couple with a first grid array lead;
   a first capacitive unit coupled to the first and second contact pads;
   a third contact pad adapted to couple with the electronic package;
   a fourth contact pad adapted to couple with a second grid array lead;
   a second capacitive unit coupled to the third and fourth contact pads;
   a fifth contact pad adapted to coupled with the electronic package;
   a sixth contact pad adapted to couple with a third grid array lead;
   a third capacitive unit couple to the fifth and sixth pads;
   a seventh contact pad adapted to couple with the electronic package;
   an eighth contact pad adapted to couple with a fourth grid array lead; and
   a fourth capacitive unit coupled to the seventh and eighth pads.

2. The apparatus of claim 1, wherein the first capacitive unit is adapted to filter out noise from a first input/output signal traveling to or from the electronic package through the first grid array lead and the second capacitive unit is adapted to filter out noise from a second input/output signal traveling to or from the electronic package through the second grid array lead, and the first and second input/output signals being first and second portions of a differential input/output signal pair.

3. The apparatus of claim 2, wherein the differential input/output signal pair is a peripheral component interconnect (PCI) differential input/output signal pair.

4. The apparatus of claim 1, wherein the first capacitive unit is adapted to filter out noise from a first input/output signal traveling to or from the electronic package through the first grid array lead, the second capacitive unit is adapted to filter out noise from a second input/output signal traveling to or from the electronic package through the second grid array lead, the third capacitive unit is adapted to provide power to the electronic package, the fourth capacitive unit is adapted to provide ground to the electronic package, and the third and fourth capacitive units being disposed side by side, between the first and second capacitive units.

5. The apparatus of claim 4, further comprising first and second dielectric materials disposed between the first and third and fourth capacitive units, and between the second and fourth capacitive units, to electrically isolate the first and second capacitive units from the third and fourth capacitive units.

6. The apparatus of claim 4, wherein the first and second capacitive units are disposed at a first and a second periphery of the apparatus respectively.

7. The apparatus of claim 1, wherein the first capacitive unit is adapted to filter out noise from a first input/output signal traveling to or from the electronic package through the first grid array lead, the second capacitive unit is adapted to filter out noise from a second input/output signal traveling to or from the electronic package through the second grid array lead, the third capacitive unit is adapted to provide a selected one of power and ground to the electronic package, and the first and third capacitive units are disposed side by side to each other.

8. The apparatus of claim 7, further comprising a dielectric material disposed between the first and third capacitive units to electrically isolate the first and third capacitive units from each other.

9. The apparatus of claim 7, wherein the first capacitive unit is dispose at a periphery of the apparatus.

10. The apparatus of claim 1, wherein the first capacitive unit is adapted to filter out single mode noise.

11. An apparatus, comprising:
    an integrated circuit substrate; and
    an array capacitor coupled to the integrated circuit substrate, the array capacitor comprising:
    a first contact pad adapted to couple with an electronic package;

a second contact pad adapted to couple with a first grid array lead; and a first capacitive unit coupled to the first and second contact pads, the first capacitive unit adapted to filter out noise from a first input/output signal traveling to or from the electronic package through the first grid array lead; and wherein said integrated circuit substrate is a printed circuit board.

12. An apparatus, comprising:
an integrated circuit substrate;
an array capacitor coupled to the integrated circuit substrate, the array capacitor comprising:
a first contact pad adapted to couple with an electronic package;
a second contact pad adapted to couple with a first grid array lead; and
a first capacitive unit coupled to the first and second contact pads, the first capacitive unit adapted to filter out noise from a first input/output signal traveling to or from the electronic package through the first grid array lead; and
wherein the array capacitor is disposed between an electronic package and the integrated circuit substrate.

13. The apparatus of claim 12, wherein the electronic package comprises of one selected from the group consisting of a processor, an input/output device, a volatile memory and embedded passive components.

14. An apparatus, comprising:
an integrated circuit substrate;
an array capacitor coupled to the integrated circuit substrate, the array capacitor comprising:
a first contact pad adapted to couple with an electronic package;
a second contact pad adapted to couple with a first grid array lead; and
a first capacitive unit coupled to the first and second contact pads, the first capacitive unit adapted to filter out noise from a first input/output signal traveling to or from the electronic package through the first grid array lead; and
wherein the array capacitor is coupled to the integrated circuit substrate via grid array leads, one of the grid array leads coupled to the second contact pad.

15. An apparatus, comprising:
an integrated circuit substrate;
an array capacitor coupled to the integrated circuit substrate, the array capacitor comprising:
a first contact pad adapted to couple with an electronic package;
a second contact pad adapted to couple with a first grid array lead; and
a first capacitive unit coupled to the first and second contact pads, the first capacitive unit adapted to filter out noise from a first input/output signal traveling to or from the electronic package through the first grid array lead; and
wherein said array capacitor further comprising
a third contact pad adapted to couple with the electronic package;
a fourth contact pad adapted to couple with a second grid array lead; and
a second capacitive unit coupled to the third and fourth contact pads, the second capacitive unit adapted to filter out noise from a second input/output signal traveling to or from the electronic package through the second grid array lead.

16. The apparatus of claim 15, wherein the first and second input/output signals are first and second portions of a differential input/output signal pair.

17. The apparatus of claim 16, wherein the differential input/output signal pair is a peripheral component interconnect (PCI) differential input/output signal pair.

18. An apparatus, comprising:
an integrated circuit substrate;
an array capacitor coupled to the integrated circuit substrate, the array capacitor comprising:
a first contact pad adapted to couple with an electronic package;
a second contact pad adapted to couple with a first grid array lead; and
a first capacitive unit coupled to the first and second contact pads, the first capacitive unit adapted to filter out noise from a first input/output signal traveling to or from the electronic package through the first grid array lead; and
wherein the array capacitor further comprising:
a third contact pad adapted to couple with the electronic package;
a fourth contact pad adapted to couple with a second grid array lead; and
a second capacitive unit coupled to the third and fourth pads adapted to provide a selected one of power and ground to the electronic package.

19. A system, comprising:
an integrated circuit substrate;
an array capacitor coupled to the integrated circuit substrate, the array capacitor comprising:
a first contact pad adapted to couple with an electronic package;
a second contact pad adapted to couple with a first grid array lead; and
a first capacitive unit coupled to the first and second contact pads, the first capacitive unit adapted to filter out noise from a first input/output signal traveling to or from the electronic package through the first grid array lead;
a bus coupled to the integrated circuit substrate; and
a mass storage coupled to the bus.

20. The system of claim 19, wherein said integrated circuit substrate is a printed circuit board.

21. The system of claim 19, wherein said array capacitor further comprising
a third contact pad adapted to couple with the electronic package;
a fourth contact pad adapted to couple with a second grid array lead; and a second capacitive unit coupled to the third and fourth contact pads, the second capacitive unit adapted to filter out noise from a second input/output signal traveling to or from the electronic package through the second grid array lead.

22. The system of claim 21, wherein the first and second input/output signals are first and second portions of a differential input/output signal pair.

23. The system of claim 22, wherein the differential input/output signal pair is a peripheral component interconnect (PCI) differential input/output signal pair.

24. The system of claim 19, wherein the array capacitor further comprising:
a third contact pad adapted to couple with the electronic package;

a fourth contact pad adapted to couple with a second grid array lead; and a second capacitive unit coupled to the third and fourth pads adapted to provide a selected one of power and ground to the electronic package.

25. The system of claim 19, wherein the system further comprises an input/output device interface unit adapted to interface at least a selected one of a keyboard and a cursor control device.

26. The system of claim 19, wherein the system is a selected one of a set-top box, a digital camera, a CD player, a DVD player, a wireless mobile phone, a tablet computing device, or a laptop computing device.

* * * * *

UNITED STATES PATENT AND TRADEMARK OFFICE
CERTIFICATE OF CORRECTION

PATENT NO. : 7,348,661 B2  Page 1 of 1
APPLICATION NO. : 10/949582
DATED : September 24, 2004
INVENTOR(S) : Hyunjun Kim et al.

It is certified that error appears in the above-identified patent and that said Letters Patent is hereby corrected as shown below:

Column 6
Line 1, "...adapted to coupled..." should read --...adapted to couple...--.

Column 6
Line 5, "...unit couple to..." should read --...unit coupled to...--.

Column 6
Line 59, "...is dispose..." should read --...is disposed...--.

Signed and Sealed this

Eleventh Day of August, 2009

David J. Kappos
*Director of the United States Patent and Trademark Office*